United States Patent
Komatsu (10) Patent No.: US 7,474,975 B2
(45) Date of Patent: Jan. 6, 2009

(54) METHOD TO VERIFY THE OUTCOME OF CALIBRATION WITH A NETWORK ANALYZER

(75) Inventor: Yasuaki Komatsu, Hyogo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/717,352

(22) Filed: Mar. 13, 2007

(65) Prior Publication Data

US 2007/0233410 A1    Oct. 4, 2007

Related U.S. Application Data

(63) Continuation-in-part of application No. 10/983,510, filed on Nov. 8, 2004, now abandoned.

(30) Foreign Application Priority Data

Dec. 15, 2003   (JP) .............................. 2003-416015

(51) Int. Cl.
*G01M 19/00* (2006.01)

(52) U.S. Cl. ........................................ 702/85; 324/601
(58) Field of Classification Search ................... 702/85; 324/601
See application file for complete search history.

(56) References Cited

U.S. PATENT DOCUMENTS

| | | | |
|---|---|---|---|
| 5,047,725 A * | 9/1991 | Strid et al. ................... | 324/601 |
| 5,332,974 A | 7/1994 | Harkins et al. .............. | 324/606 |
| 6,529,844 B1 * | 3/2003 | Kapetanic et al. ............. | 702/85 |
| 2004/0160228 A1 * | 8/2004 | Jamneala et al. ............ | 324/601 |

OTHER PUBLICATIONS

Agilent Technologies, Inc., "User's and Service Guide, Agilent Technologies 85053B 3.5mm Verification Kit", pp. 4-1-4-18, Jan. 2002.

* cited by examiner

*Primary Examiner*—Edward Cosimano
*Assistant Examiner*—Jonathan Teixeira Moffat
(74) *Attorney, Agent, or Firm*—Marc Bobys (57) ABSTRACT

Making use of the values of error items quantified during full n-port calibration, an indicator of whether or not all calibration steps have been uniformly conducted (calibration consistency) is calculated and the result of the calibration is confirmed based on this indicator.

10 Claims, 9 Drawing Sheets

METHOD TO VERIFY THE OUTCOME OF CALIBRATION WITH A NETWORK ANALYZER

CROSS-REFERENCED APPLICATIONS

This application is a Continuation-in-Part of U.S. patent application Ser. No. 10/983,510, filed on Nov. 8, 2004 and abandoned, which is incorporated herein by reference in its entirety.

1. FIELD OF THE INVENTION

The present invention relates to a method to verify the result of calibration with a network analyzer, and in particular, to a method to verify the result of full n-port calibration. In addition, the present invention pertains to a network analyzer comprising means for performing this verification method and a program for performing this verification method.

2. DISCUSSION OF THE BACKGROUND ART

A network analyzer is calibrated in order to eliminate measurement errors. However, there are cases where this calibration is not completed correctly because of problems with the stability of the network analyzer, the malfunction of standards, and other problems. Therefore, it is necessary to verify the result of the calibration.

Testing devices with a known S parameter (Scattering parameter) represent the recommended method for verifying calibration in the prior art. Standard sets for verification referred to as verification kits, standards other than calibration standards used for calibration, and other devices are used in actual calibration (for instance, refer to User's and Service Guide, Agilent Technologies, 85053B 3.5 mm Verification Kit," Agilent Technologies, January, 2002, p. 4-1 through 4-18). Moreover, there are also cases where standards used in calibration are re-used (for instance, refer to U.S. Pat. No. 5,332,974).

Verification of calibration by the prior art poses the following problems. For instance, it is difficult to handle the verification kit of the verification method that employs a verification kit and therefore, there tend to be mistakes in the calibration verification. Furthermore, this verification method requires its own specific verification kit. If the verification method that uses standards other than calibration standards is employed, verification results are sometimes obtained that indicate that the calibration was successful even though there were actual mistakes in the verification when the other standards have properties similar to calibration standards. Furthermore, this verification method requires standards other than calibration standards. When the verification method whereby calibration standards are re-used is employed, there can be times when verification results indicating that the calibration was successful are obtained even though there were actually errors in the calibration. Moreover, the above-mentioned conventional verification methods require additional measurements for verification independent of calibration. These problems become more severe with an increase in the number of ports, making verification of calibration difficult.

Therefore, the object of the present invention is to solve these problems. That is, the object of the present invention is to provide a method for verifying full n-port calibration that is easier to use than the prior art and does not require additional standards or additional measurement.

SUMMARY OF THE INVENTION

The present invention introduces the concepts of "uniformity during the calibration steps" and "calibration consistency" for verification of full n-port calibration in order to accomplish this goal. The verification method of the present invention verifies the result of calibration by analyzing whether the calibration has been uniformly performed during the calibration steps and whether there is consistency in systematic error terms obtained by calibration. Systematic error terms are simply referred to hereafter as error terms.

That is, one embodiment according to the present invention is a method to verify a SOLT calibration of a network analyzer whereby full n-port calibration of a network analyzer is verified, characterized by making use of the fact that error terms obtained by this calibration are redundant; the uniformity of the calibration steps during this calibration is calculated using these error terms; and the result of this calibration is verified by assessing this calculated uniformity.

Another embodiment is a method to verify a SOLT calibration of a network analyzer whereby full n-port calibration of a network analyzer is verified, characterized by making use of the fact that error terms obtained by this calibration are redundant; the consistency of these error terms is calculated; and the result of this calibration is verified by assessing this calculated consistency.

Still yet another embodiment is a method to verify a SOLT calibration of a network analyzer whereby full n-port calibration of a network analyzer is verified, characterized in that each error term obtained by this calibration is calculated by the following equation, substituting $Ed_i$ for forward directivity, $Ed_j$ for reverse directivity; $Es_i$ for forward source match, $Es_j$ for reverse source match, $Er_i$ for forward reflection tracking, $Er_j$ for reverse reflection tracking, $Et_{ji}$ for forward transmission tracking, $Et_{ij}$ for reverse transmission tracking, $Ex_{ji}$ for forward isolation, $Ex_{ij}$ for reverse isolation, $El_{ji}$ for forward load match, and $El_{ij}$ for reverse load match; and the result of this calibration can be verified by assessing the calculated values.

[Mathematical formula 4]

$$\frac{Et_{ji} - Ex_{ji}}{Er_j + Ed_j*[El_{ji} - Es_j]} * \frac{Et_{ij} - Ex_{ij}}{Er_i + Ed_i*[El_{ij} - Es_i]}$$

Furthermore, another embodiment of the present invention is a network analyzer comprising means for performing a verification method, characterized by making use of the fact that error terms obtained by this calibration are redundant; it has means for calculating the uniformity of the calibration steps during this calibration using these error terms once full n-port calibration has been performed; and the result of this calibration can be verified.

Additionally, another embodiment of the present invention is a network analyzer comprising means for performing a verification method, characterized by making use of the fact that error terms obtained by this calibration are redundant; it has means for calculating the consistency of these error terms once full n-port calibration has been performed; and the result of this calibration can be verified.

Another embodiment is a network analyzer comprising means for performing a verification method, characterized in that it has means for calculating each error term obtained by this calibration once full n-port calibration is performed by the following equation, substituting $Ed_i$ for forward directivity, $Ed_j$ for reverse directivity, $Es_i$ for forward source match, $Es_j$ for reverse source match, $Er_i$ for forward reflection tracking, $Er_j$ for reverse reflection tracking, $Et_{ji}$ for forward transmission tracking, $Et_{ij}$ for reverse transmission tracking, $Ex_{ji}$ for forward isolation, $Ex_{ij}$ for reverse isolation, $El_{ji}$ for forward load match, and $El_{ij}$ for reverse load match.

[Mathematical formula 5]

$$\frac{Et_{ji} - Ex_{ji}}{Er_j + Ed_j * [El_{ji} - Es_j]} * \frac{Et_{ij} - Ex_{ij}}{Er_i + Ed_i * [El_{ij} - Es_i]}$$

This network analyzer further comprises a means for assessing the values obtained by the above-mentioned calculation.

The present invention also includes a program, which enables a computer to act as a means for reading error terms obtained by calibration from a network analyzer and a means for calculating the uniformity during this calibration process using theses error terms that have been read and making use of the fact that these error terms are redundant in order to verify full n-port calibration of the network analyzer.

Still yet a further embodiment of the present invention is a program, which enables a computer to act as a means for reading error terms obtained by calibration from a network analyzer and a means for calculating the consistency during this calibration process using these error terms that have been read and making use of the fact that these error terms are redundant in order to verify full n-port calibration of the network analyzer.

Yet another embodiment of the present invention is a program, which enables a computer to function as a means for reading the error terms obtained by calibration from a network analyzer and a means for calculating each of these error terms that have been read, substituting $Ed_i$ for forward directivity, $Ed_j$ for reverse directivity, $Es_i$ for forward source match, $Es_j$ for reverse source match, $Er_i$ for forward reflection tracking, $Er_j$ for reverse reflection tracking, $Et_{ji}$ for forward transmission tracking, $Et_{ij}$ for reverse transmission tracking, $Ex_{ji}$ for forward isolation, $Ex_{ij}$ for reverse isolation, $El_{ji}$ for forward load match, and $El_{ij}$ for reverse load match in order to verify full n-port calibration of a network analyzer.

[Mathematical formula 6]

$$\frac{Et_{ji} - Ex_{ji}}{Er_j + Ed_j * [El_{ji} - Es_j]} * \frac{Et_{ij} - Ex_{ij}}{Er_i + Ed_i * [El_{ij} - Es_i]}$$

The program may further act as a means for assessing the value obtained by this calculation.

DETAILED DESCRIPTION OF THE PREFERRED EMBODIMENT

By means of the present invention, calibration consistency is calculated using error terms that are quantified by calibration and these calculation results and the result of the calibration are verified. Therefore, additional standards and measurement thereof are not necessary for verifying the calibration. Moreover, because additional standards and measurement thereof are not necessary, verification of calibration can be easily performed when compared to the prior art. Furthermore, because additional standards and measurement thereof are not necessary, it is possible to prevent the misconception that calibration is successful even though there are actually errors in the calibration.

The present invention will now be described in detail based on the embodiments shown in the attached drawings. These embodiments are employed when the present invention is used for verification of calibration in the case of a two-port network analyzer. The first embodiment of the present invention is the case where the network analyzer itself verifies its own calibration. The second embodiment of the present invention is the case where an external control device verifies the calibration of a network analyzer.

Figure 1:
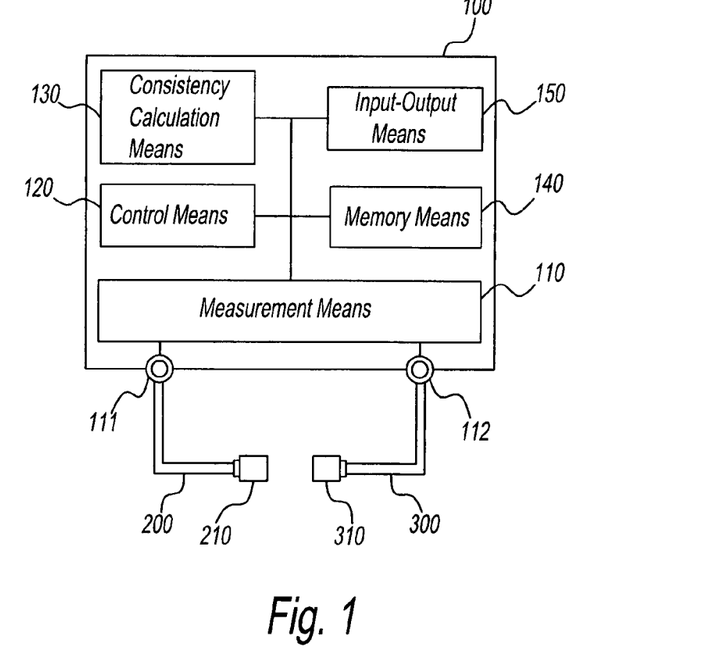
FIG. 1 is a block diagram showing the first embodiment of the present invention.

The first embodiment will be described first. FIG. 1 is a block diagram showing a two-port network analyzer of the present embodiment. A network analyzer 100 in FIG. 1 comprises a measurement means 110, a control means 120, a consistency calculation means 130, a memory means 140, and an input-output means 150. Measurement means 110 comprises a measurement port 111 and a measurement port 112, and analyzes the network properties of devices connected to these measurement ports. Control means 120 controls measurement means 110, and similar means, and measures, calibrates, and verifies the calibration of network analyzer 100 by executing a program. Control means 120 is, for instance, a microprocessor (MPU) or a digital signal processor (DSP). Consistency calculation means 130 calculates the "calibration consistency," which is an indicator for verifying the result of a calibration. "Calibration consistency" will be discussed later. Memory means 140 houses the measurement results of measurement means 110, the processing order of control means 120, and similar data, and reads the stored data. Memory means 140 is, for instance, a semiconductor memory, a hard disk drive, or a removable disk. Input-output means 150 inputs and outputs to users of network analyzer 100 and to external devices. Input-output means 150 is a keyboard, a display, or a LAN interface. The network analyzer is usually connected to a device under test by a cable or fixture. A coaxial cable 200 is connected to measurement port 111 of network analyzer 100 in FIG. 1, while a coaxial cable 300 is connected to measurement port 112. Although not illustrated, the device under test is connected to at least one of either a connector 210 of coaxial cable 200 or a connector 310 of coaxial cable 300.

Next, a method to verify full two-port calibration by network analyzer 100 will be described. Full-port calibration is conducted using four types of standards, short, open, load, and through; therefore it is called SOLT calibration.

Figure 2:
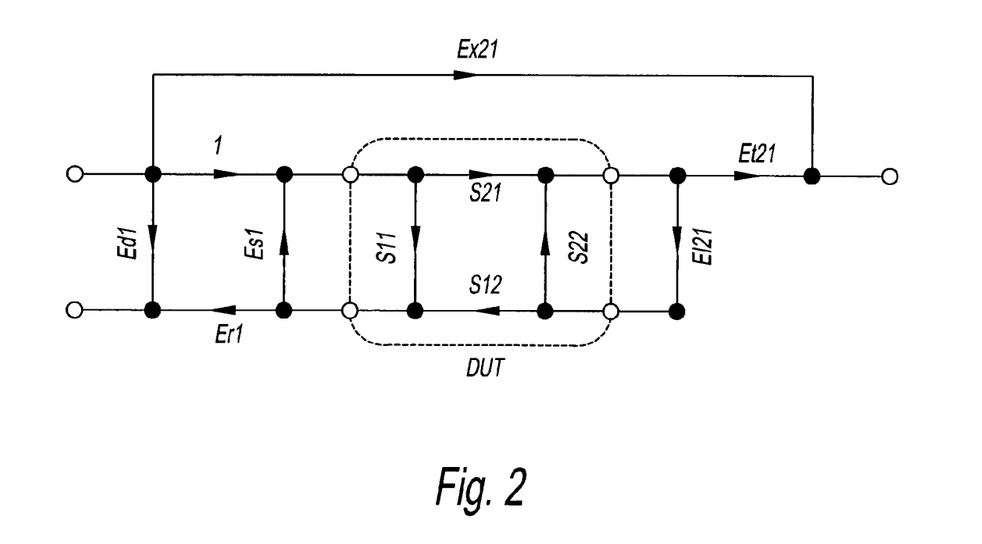
FIG. 2 is a signal flow chart showing the forward model of a 2-port, 12-terms error model.
Figure 3:
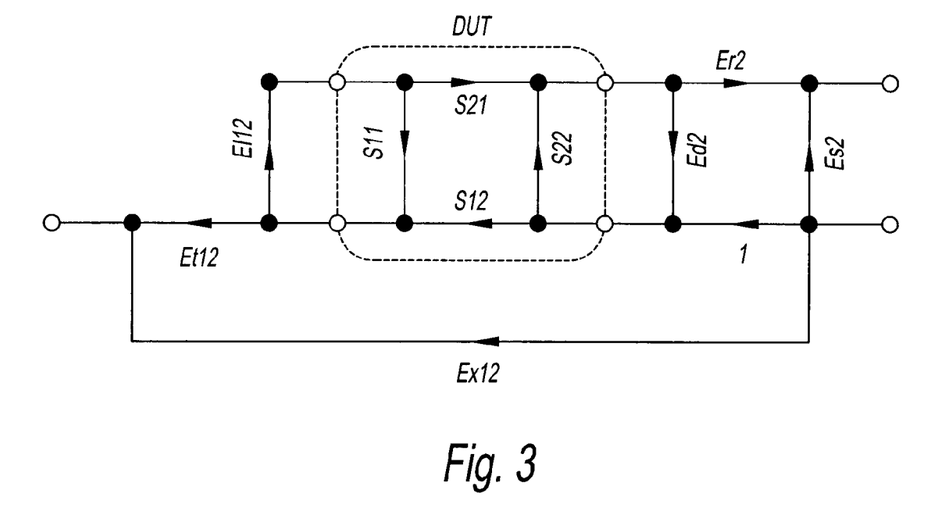
FIG. 3 is a signal flow chart showing the reverse model of a 2-port, 12-terms error model.
Figure 4:
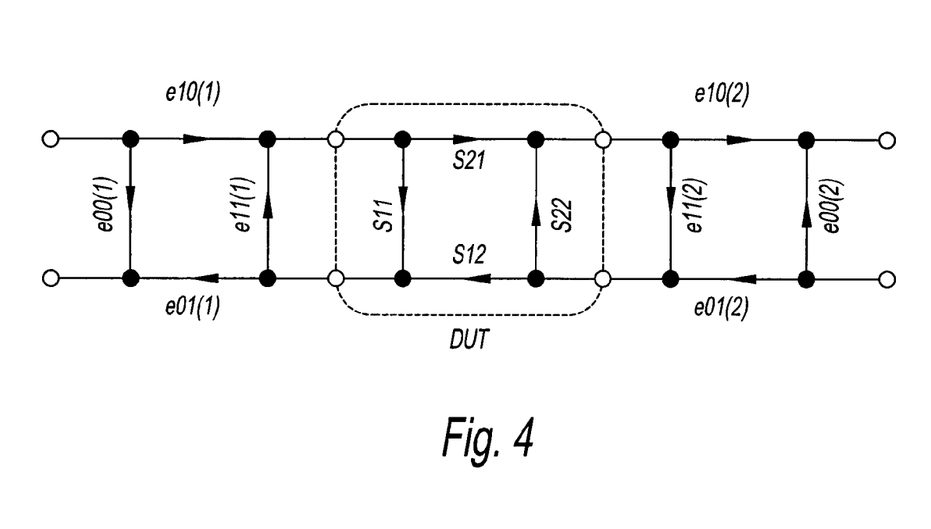
FIG. 4 is a signal flow chart showing a 2-port, 8-terms error model.

The verification method of the present invention verifies the result of calibration making use of the fact that error terms that are quantified when a network analyzer is calibrated are redundant. Therefore, the fact that error terms are redundant is described below. Refer to FIGS. 2, 3, and 4.

FIG. 2 shows a forward model of a two-port 12-terms error model that is quantified by SOLT calibration. FIG. 3 shows a reverse model of the same two-port, 12-terms error model. $Ed_1$ is forward directivity. $Ed_2$ is reverse directivity. $Es_1$ is forward source match. $Es_2$ is reverse source match. $Er_1$ is forward reflection tracking. $Er_2$ is reverse reflection tracking. $Et_{21}$ is forward transmission tracking. $Et_{12}$ is reverse transmission tracking. $Ex_{21}$ is forward isolation (forward crosstalk). $Ex_{12}$ is reverse isolation (reverse crosstalk). $El_{21}$ is forward load match, $El_{12}$ is reverse load match. The broken lines in FIGS. 2 and 3 show the device under test (DUT).

FIG. 4 shows a two-port, eight-terms error model quantified by TRL two-port calibration. e01 (i), e10(i), e00(i), and e11(i) are error terms. i is a natural number indicating the port number. It is 1 or 2 in this case. Moreover, the broken lines in FIG. 4 show the device under test (DUT).

Figure 5:
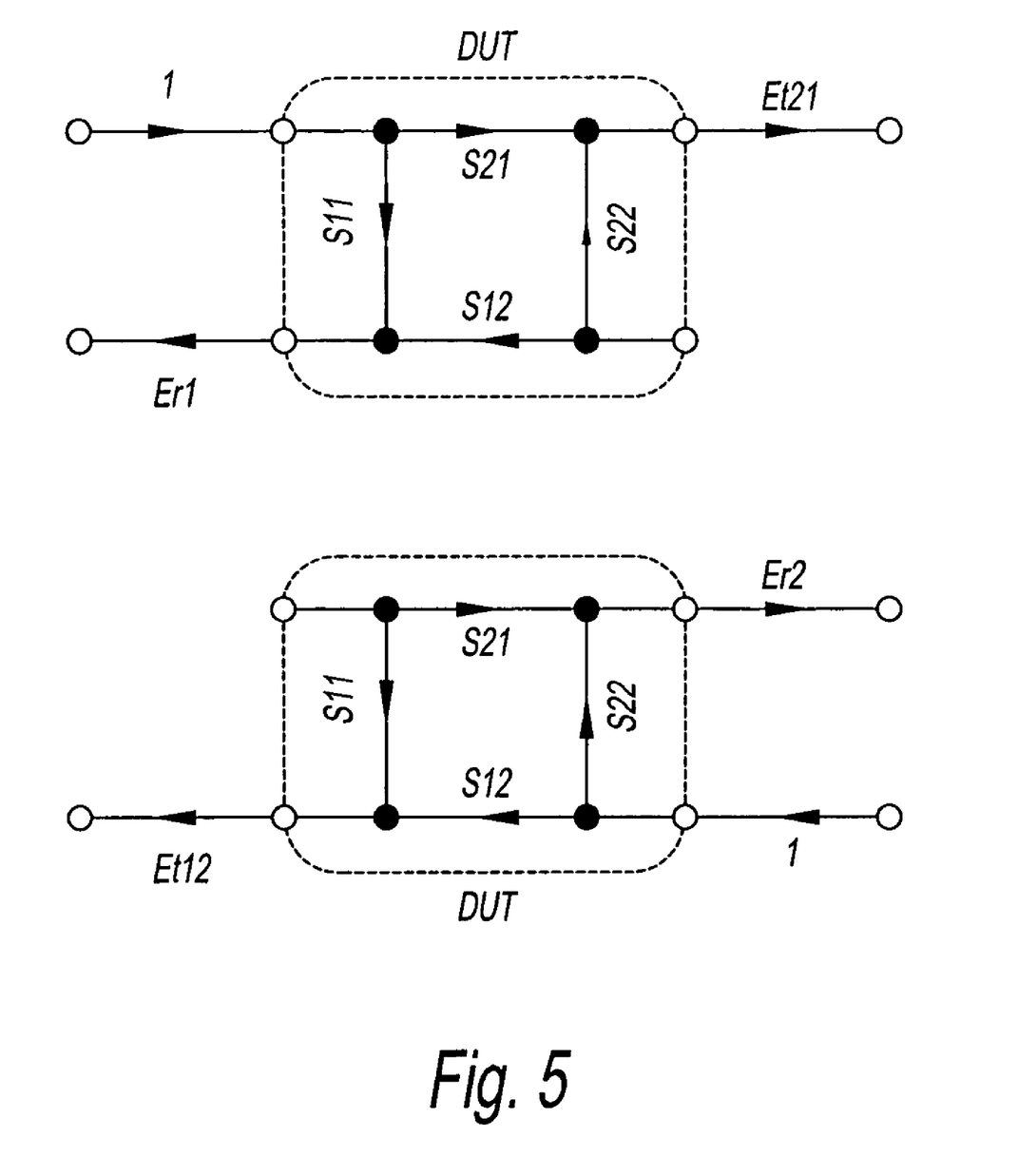
FIG. 5 is a signal flow chart showing a limited representation of a 2-port, 12-terms error model.
Figure 6:
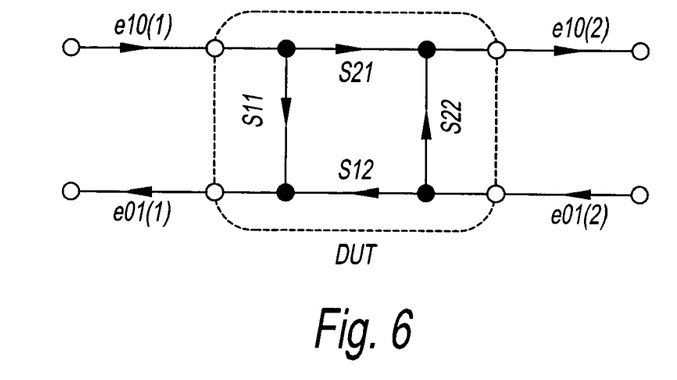
FIG. 6 is a signal flow chart showing a limited representation of a 2-port, 8-terms error model.
Figure 7:
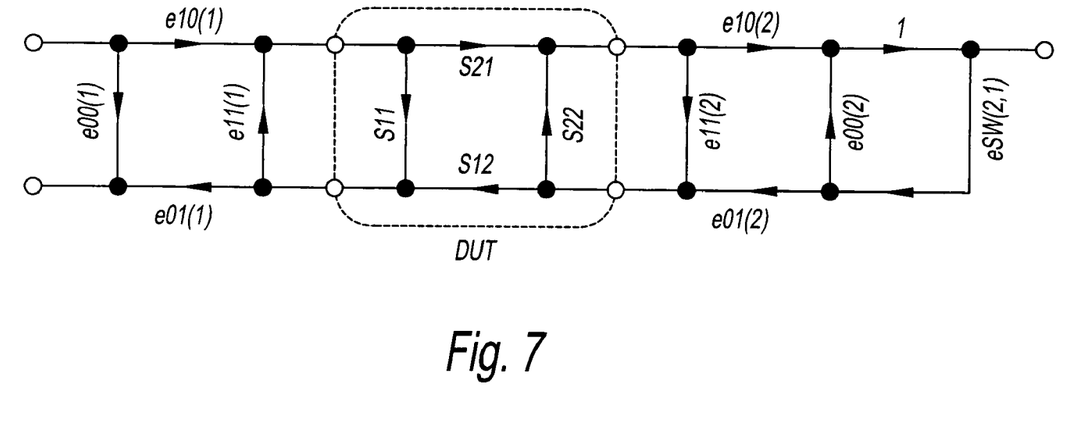
FIG. 7 is a signal flow chart showing a 2-port, 8-terms error model that takes switch match into consideration.

The error models shown in FIGS. 2 and 4 are representations limited to frequency response (reflection tracking and transmission tracking). The limited two-port, 12-terms error model is shown in FIG. 5. The signal flow in the top panel of FIG. 5 shows the forward error model and the signal flow in the bottom panel shows the reverse error model. The limited two-port eight-terms error model is shown in FIG. 6. The broken lines in FIGS. 5 and 6 show the device under test (DUT). When the error model in FIG. 5 and the error model in FIG. 6 are compared, the following formula is derived.

[Mathematical formula 7]

$$1*Er_1=e10(1)*e01(1) \quad 1*Et_{12}=e01(2)*e01(1) \quad \text{(Formula 1)}$$

$$1*Er_2=e10(2)*e01(2) \quad 1*Et_{21}=e10(1)*e10(2) \quad \text{(Formula 1)}$$

Formula 2 is further derived from formula 1.

[Mathematical formula 8]

$$\begin{aligned} Er_2*Er_1 &= [e10(2)*e01(2)]*[e10(1)*e01(1)] \\ &= [e10(1)*e10(2)]*[e01(2)*e01(1)] \\ &= Et_{21}*Et_{12} \end{aligned} \quad \text{(Formula 2)}$$

When formula 2 is modified, formula 3 is obtained.

[Mathematical formula 9]

$$\frac{Et_{21}*Et_{12}}{Er_2*Er_1} = \frac{[e10(1)*e10(2)]*[e01(2)*e01(1)]}{[e10(2)*e01(2)]*[e10(1)*e01(1)]} = 1 \quad \text{(Formula 3)}$$

Formulas 2 and 3 show that the error terms found during calibration are redundant. e01(x) and e10(y) are not found independently even if calibration is performed. They are found in the form of a sum enclosed in brackets, such as [e01(2)*e10(1)].

The verification method of the present invention makes use of the fact that the error terms are redundant and analyzes the uniformity during the calibration steps to verify the result of the calibration. The calibration steps and the uniformity thereof will be described below. In order to quantify multiple error terms by calibration with a network analyzer, multiple independent calibrations are performed. The calibration steps used here mean the steps relating to individual measurements executed during calibration. Consequently, the calibration steps include not only measurement, but also procedures such as connecting the connectors, and similar procedures. An example of the calibration steps are the steps in full two-port calibration that involve connecting the open standards to port 1 and measuring the reflection properties at port 1. Another example of calibration steps with full two-port calibration are the steps of connecting the short standards to port 1 and measuring reflection properties at port 1. $Er_1$, $Er_2$, $Et_{21}$, $Et_{12}$, and the sum inside the brackets that are included in formula 2 are found by executing at least one calibration step. The same calibration step is not executed multiple times for one calibration. Consequently, unless all the calibration steps are executed uniformly, formula 3 will not be established. On the other hand, formula 3 will be established if all calibration steps are uniformly executed. In the strict sense, formula 3 is a required condition, not a satisfactory condition, for uniformly executing all calibration steps. However, it hardly appears that several factors will coincidentally be negated as long as formula 3 is established once a certain frequency range has been swept. Consequently, formula 3 can be regarded as a satisfactory condition for uniformly executing all calibration steps. The verification method of the present invention verifies the result of calibration by analyzing the uniformity of the calibration steps as represented by formula 3, or a modified version of formula 3. By means of the verification method of the present invention, the left side of formula 3 is defined as the "calibration consistency" (formula 4), and is used as a measure of the extent to which all calibration steps were executed uniformly (calibration step uniformity). All calibration steps are executed with greater uniformity and there is no inconsistency in the error terms as the calibration consistency approaches 1. The uniformity of the calibration steps and the consistency of the error terms are controlled by conditions relating to the individual measurements performed during the calibration, including network analyzer stability, reproducibility of the connectors, and definition and exchangeability of the standards. Consequently, when the network analyzer becomes unstable during a certain calibration step, for instance, the uniformity of the calibration steps collapses and the calibration consistency moves away from 1. Another measure with a modified version of formula 3 can also be used as a measure of the uniformity and consistency when verifying calibration.

[Mathematical formula 10]

$$\begin{aligned} \text{Calibration consistency} &= \frac{Et_{21}*Et_{12}}{Er_2*Er_1} \\ &= \frac{[e10(1)*e10(2)]*[e01(2)*e01(1)]}{[e10(2)*e01(2)]*[e10(1)*e01(1)]} \end{aligned} \quad \text{(Formula 4)}$$

Furthermore, formula 4 is modified taking into consideration switch match. This procedure is described below. Switch match is the difference between load match and source match at each port of a network analyzer. Equal load match and source match is a prerequisite of 8-terms error models. However, load match and source match generally are not equal and therefore, the difference between these matches is added to the eight-terms error model as switch match.

The two-port, eight-terms error model to which switch match has been added is shown in FIG. 6. The broken line in FIG. 6 shows the device under test (DUT). The two-port error model to which switch match has been added is converted to a 12-terms error model. When FIGS. 2 and 6 are compared, formula 5 is obtained.

[Mathematical formula 11]

$$El_{21} = e11(2) + \frac{e01(2) * e10(2) * eSW(2,1)}{1 - e00(2) * eSW(2,1)} \quad \text{(Formula 5)}$$

When formula 5 is modified, formula 6 is obtained.

[Mathematical formula 12]

$$eSW(2,1) = \frac{El_{21} - e11(2)}{El_{21} * e00(2) - e11(2) * e00(2) + e01(2) * e10(2)} \quad \text{(Formula 6)}$$

When FIGS. 3 and 4 are compared, the following formula is obtained.

[Mathematical formula 13]

$e11(2) = Es_2$ $e00(2) = Ed_2$ $e01(2) * e10(2) = Er_2$

When the formula above is substituted in formula 6, formula 7 is obtained.

[Mathematical formula 14]

$$eSW(2,1) = \frac{El_{21} - Es_2}{El_{21} * Ed_2 - Es_2 * Ed_2 + Er_2} \quad \text{(Formula 7)}$$

When FIGS. 2 and 6 are compared here, formula 8 is obtained.

[Mathematical formula 15]

$$Et_{21} = \frac{e10(2) * e10(1)}{1 - e00(2) * eSW(2,1)} \quad \text{(Formula 8)}$$

When formula 8 is further modified, formula 9 is obtained.

[Mathematical formula 16]

$$e10(2) * e10(1) = Et_{21} * [1 - e00(2) * eSW(2,1)] \quad \text{(Formula 9)}$$
$$= Et_{21} * [1 - Ed_2 * eSW(2,1)]$$

When formula 7 is substituted in formula 9, formula 10 is obtained.

[Mathematical formula 17]

$$e10(2) * e10(1) = \frac{Et_{21} * Er_2}{Er_2 + Ed_2 * [El_{21} - Es_2]} \quad \text{(Formula 10)}$$

When isolation is taken into consideration, formula 10 is modified as shown in formula 11. When formula 11 is generalized, formula A-1 is obtained. i and j are the port numbers.

[Mathematical formula 18]

$$e10(2) * e10(1) = \frac{(Et_{21} - Ex_{21}) * Er_2}{Er_2 + Ed_2 * [El_{21} - Es_2]} \quad \text{(Formula 11)}$$

[Mathematical formula 19]

$$e10(i) * e10(j) = \frac{(Et_{ij} - Ex_{ij}) * Er_i}{Er_i + Ed_i * [El_{ij} - Es_i]} \quad \text{(Formula A-1)}$$

When formula A-1 is substituted in the right side of formula 4, formula A-1 is obtained. It should be noted that the formulas are simultaneously substituted and modified using the fact that $e01(1)*e10(1) = Er_1$ and $e01(2)*e10(2) = Er_2$. [ARE THESE CORRECT BASED UPON THE CHANGES TO FORMULA A-1 ABOVE?]

[Mathematical formula 20]

Calibration consistency = (Formula A-2)

$$\frac{Et_{21} - Ex_{21}}{Er_2 + Ed_2 * [El_{21} - Es_2]} * \frac{Et_{12} - Ex_{12}}{Er_1 + Ed_1 * [El_{12} - Es_1]}$$

As previously described, by taking into consideration switch match, formula 4 is expanded as shown in formula 13 and the consistency relating to all error terms in a two-port 12-terms error model is found by this formula 13. The "calibration consistency" shown by formula 13 is used in the verification method of the present embodiment as a measure of the uniformity of all calibration steps. Of course, a measure from modified formula 13 can also be used. To repeat, all calibration steps are executed with greater uniformity and there is no inconsistency in the error terms as the calibration consistency approaches 1. In short, it can be concluded that the calibration moves closer to perfection as the calibration consistency approaches 1.

Network analyzer 100 of the present embodiment calculates the consistency of the calibration shown in formula 13 based on the above-mentioned verification method and verifies the result of the calibration. Actually, control means 120 executes the program housed in memory means 140 and controls measurement means 110, and the like to verify the calibration. This verification procedure is in accordance with the flow chart shown in FIG. 8.

First, full two-port calibration is performed in step S10. Control means 120 quantifies 12 error terms from the measurement results of measurement means 110. Calibration is executed at multiple frequency points. The frequency points at which calibration is performed are called calibration frequency points hereafter. There are times when the calibration frequency points are the same as the frequency points at which measurements are actually performed, and there are times when they are different. When multiple frequency points are calibrated as described above, 12 error terms are quantified for each frequency point and 12 error terms are stored in memory means 140 for each frequency point. For instance, if there are eight calibration frequency points, 96 error terms are stored in memory means 140. The calibration in this step can also be executed in advance outside of the flow chart shown in FIG. 8.

Figure 8:
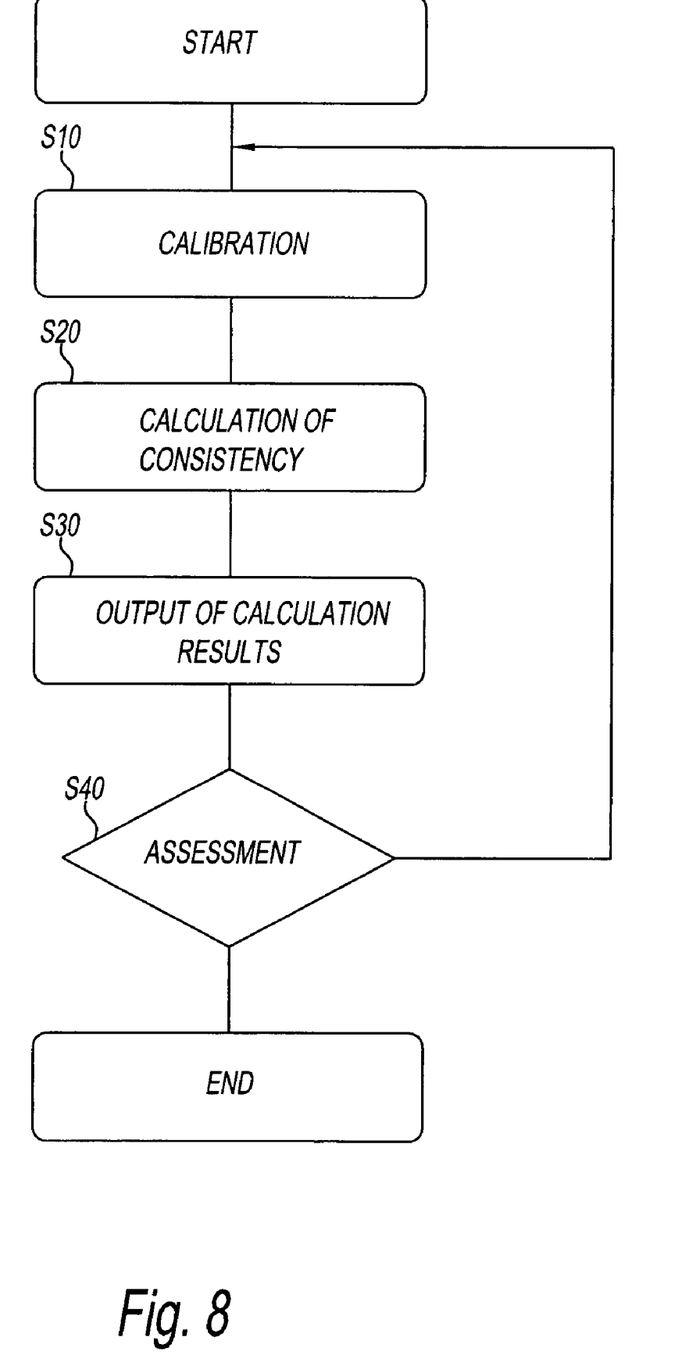
FIG. 8 is a flow chart showing the procedure for verifying the calibration in the present embodiment.

Next, in step S20, consistency calculation means 130 reads the values of the 12 error terms from memory means 140 and calculates the calibration consistency using these values. This consistency is calculated for each frequency point for which 12 error terms are quantified.

Then, the calculated calibration consistency is output in step S30. The result of calibration can be assessed by the operator of the network analyzer and by external devices based on the output in this step. In the present embodiment, a graph in which the ordinate represents the consistency and the abscissa represents the frequency is output to input-output means 140. The form in which the results are output can be numerical, graphic, or another form.

In step S40, the result of calibration is assessed based on the consistency of the calibration that was previously calculated. For instance, if the calculated consistency is within ±0.1 dB, the calibration is assessed as successful. Processing is completed when the calibration is assessed as being successful. When the calibration is assessed as having failed, the process returns to step S10 to repeat the calibration. Assessment of the result of calibration can be performed mechanically in accordance with certain conditions, or it can be performed in accordance with instructions from the network analyzer operator or external devices. Moreover, the calibration can be repeated at any time and therefore, this step can also be omitted from the flow chart.

The verification method of the present invention is not limited to a two-port network analyzer and can also be used with a multiport network analyzer having three or more measurement ports. Full n-port calibration where n is three or greater is an expansion of the full two-port calibration, which can be broken down into a combination of $_nC_2$ full two-port calibrations. Consequently, when the "calibration consistency" is calculated for the full two-port calibration that is executed between port i and port j, the result of the calibration between the i and j ports can be verified. The calibration consistency between the i and j ports can be calculated based on the general formula modified from formula A-2 (formula A-3) or the general formula modified from formula 13 (formula 14). If the network analyzer is sophisticatedly manufactured, at least one of $Ed_i$, $Ed_j$, $El_j$, $El_{ji}$, $El_{ij}$, $Es_i$ and $Es_j$ can be removed from Formula A-3 or Formula 14.

$$\text{Calibration Consistency} = \frac{Et_{ji}}{Er_j + Ed_j * [El_{ji} - Es_j]} * \frac{Et_{ij}}{Er_i + Ed_i * [El_{ij} - Es_i]} \quad \text{(Formula A-3)}$$

$$\text{Calibration Consistency} = \frac{Et_{ji} - Ex_{ji}}{Er_j + Ed_j * [El_{ji} - Es_j]} * \frac{Et_{ij} - Ex_{ij}}{Er_i + Ed_i * [El_{ij} - Es_i]} \quad \text{(Formula 14)}$$

The result of full n-port calibration wherein n is 3 or greater is verified by finding and assessing the calibration consistency with full 2-port calibration of all $_nC_2$ sets. In this case, if the consistency of full n-port calibration wherein n is 3 or greater is recognized as the worst calibration consistency between ports, the result of the entire calibration can be verified and the conditions for use are good. Moreover, if the calibration consistency is assessed for each port, the combination of ports that fail calibration can be determined and calibration between all ports is not necessary.

In the above-mentioned description the entire verification of calibration by the verification method of the present invention is processed with the network analyzer. However, the use of the present invention is not restricted to this embodiment.

In other words, there can be other embodiments of the present invention as long as they make possible the calculation of the calibration consistency after calibration. For instance, another embodiment of the verification method of the present invention is verification performed by an external control device, such as a computer, connected to the network analyzer.

Figure 9:
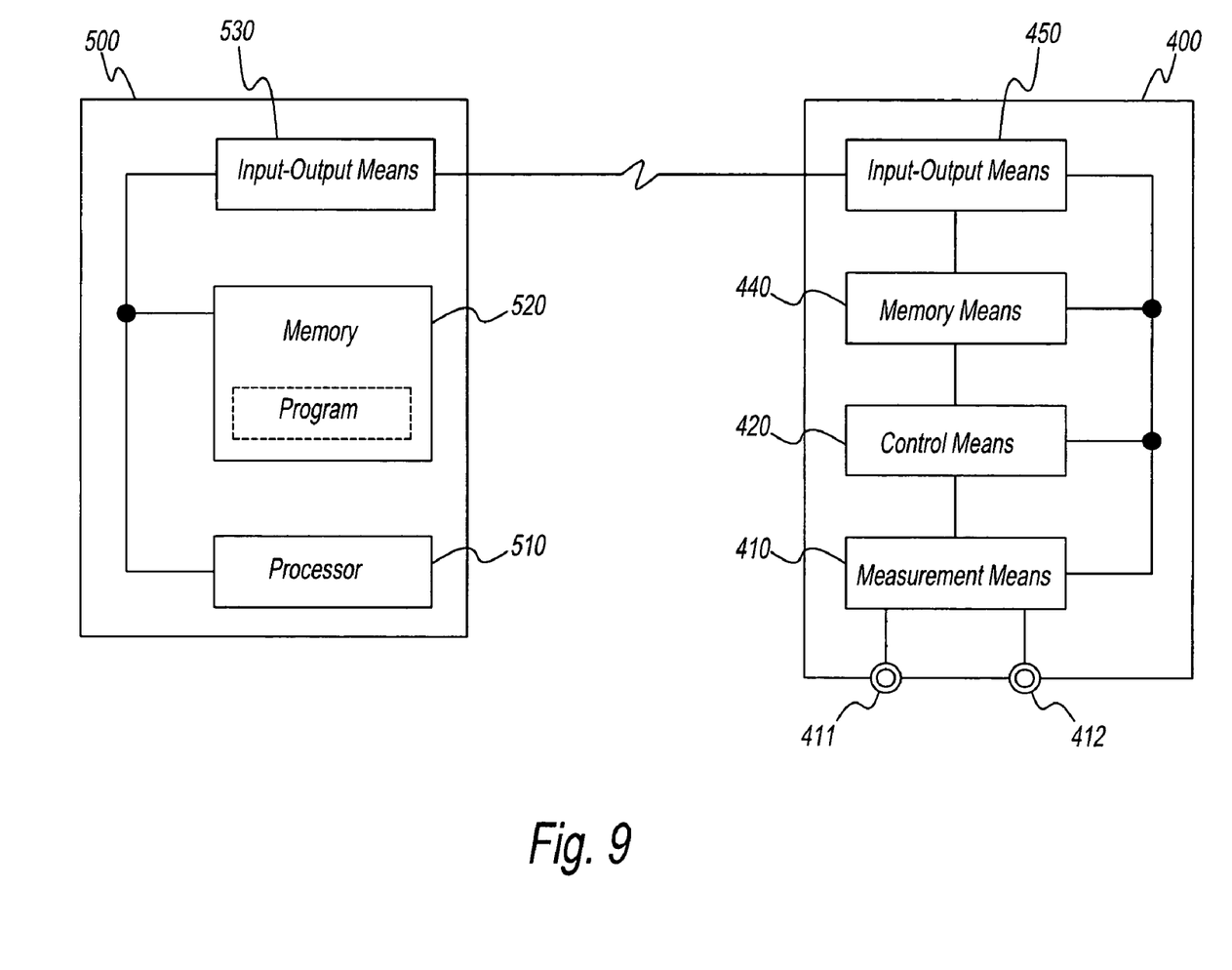
FIG. 9 is a block diagram showing a second embodiment of the present invention.
Figure 10:
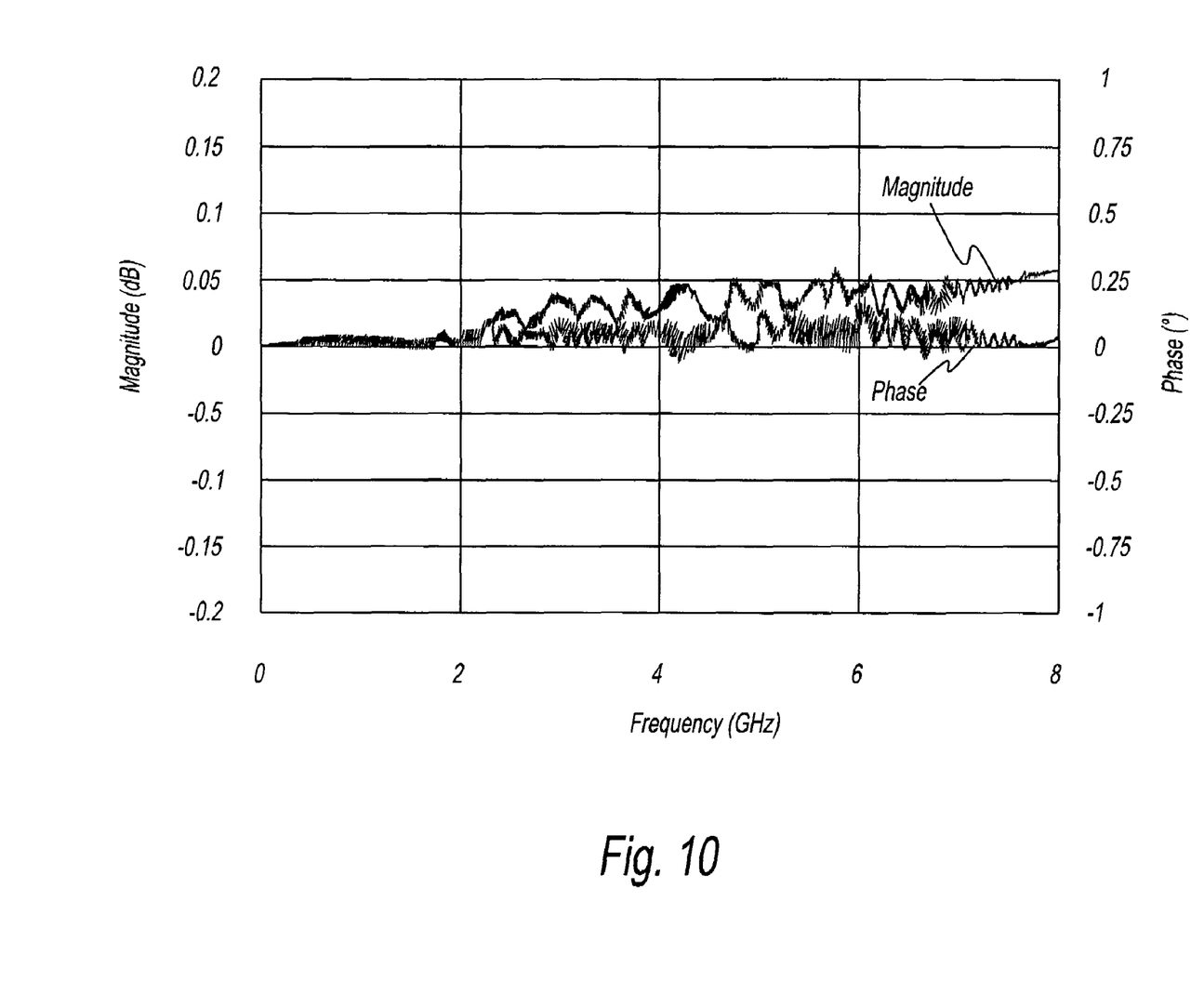
FIG. 10 is a graph showing the calibration consistency as calculated by the verification method of the present invention.

This second embodiment of the present invention will be described below. FIG. 9 is a block diagram showing the embodiment with a network analyzer and a computer as an example of an external control device. A network analyzer 400 in FIG. 9 comprises a measurement means 410, a control means 420, a memory means 440, and an input-output means 450. Measurement means 410 comprises a measurement port 411 and a measurement port 412. The network properties of devices connected to these measurement ports are analyzed. Control means 420 controls measurement means 410, and similar means and performs processes that include the calibration and measurement of network analyzer 400 by execution of a program. Control means 420 is, for instance, an MPU or DSP. Memory means 440 houses the measurement results of measurement means 410, the processing order of control means 420, and similar data, and reads the stored data. Memory means 440 is, for instance, a semiconductor memory, a hard disk drive, or a removable disk. Input-output means 450 is a keyboard, a display, or a LAN interface. A computer 500 in FIG. 9 comprises a processor 510, a memory 520, and an input-output means 530. Processor 510 performs various processes in accordance with programs pre-stored in memory 520 or programs input from the outside via input-output means 530. Memory 520 stores programs that direct the processing by processor 510 and the data generated by this processing. For instance, memory 520 is a memory means such as a semiconductor memory or a hard disk drive housed inside computer 500. Input-output means 530 is a function means for unidirectional or bidirectonal communication between computer 500 and the outside. For instance, input-output means 530 is a keyboard, a display, a LAN interface, or a removable disk. Input-output means 450 and input-output means 530 are connected to one another by a radio communications medium or a wireless communications medium.

Next, the procedure by which computer 500 verifies the calibration of network analyzer 400 will be described. First, network analyzer 400 performs full n-port calibration, itself or by external instructions. Moreover, processor 510 performs the following processing by instructions from the programs stored in memory 520. First, processor 510 controls input-output means 530 and reads the values of error terms quantified by the calibration of network analyzer 400 from network analyzer 400. The values of the error terms that have been read are either stored in memory 520 or are directly sent to processor 510. Then processor 510 calculates the consistency of the calibration using the values of these error terms that have been read and outputs the calculation results. The calculation of the calibration consistency is in accordance with the method described in the first embodiment. The calculation results can be output to computer 500, network analyzer 400, or another device. Processor 510 also can assess the calculated calibration consistency using a pre-determined value as the criterion and mechanically verify the result of the calibration.

The verification method of the present invention can be similarly used when network analyzer 400 and computer 500 are not connected. Computer 500 can intermittently read the error terms from network analyzer 400 using a removable memory medium, such as a floppy disk, in place of the above-mentioned communications means.

Figure 11:
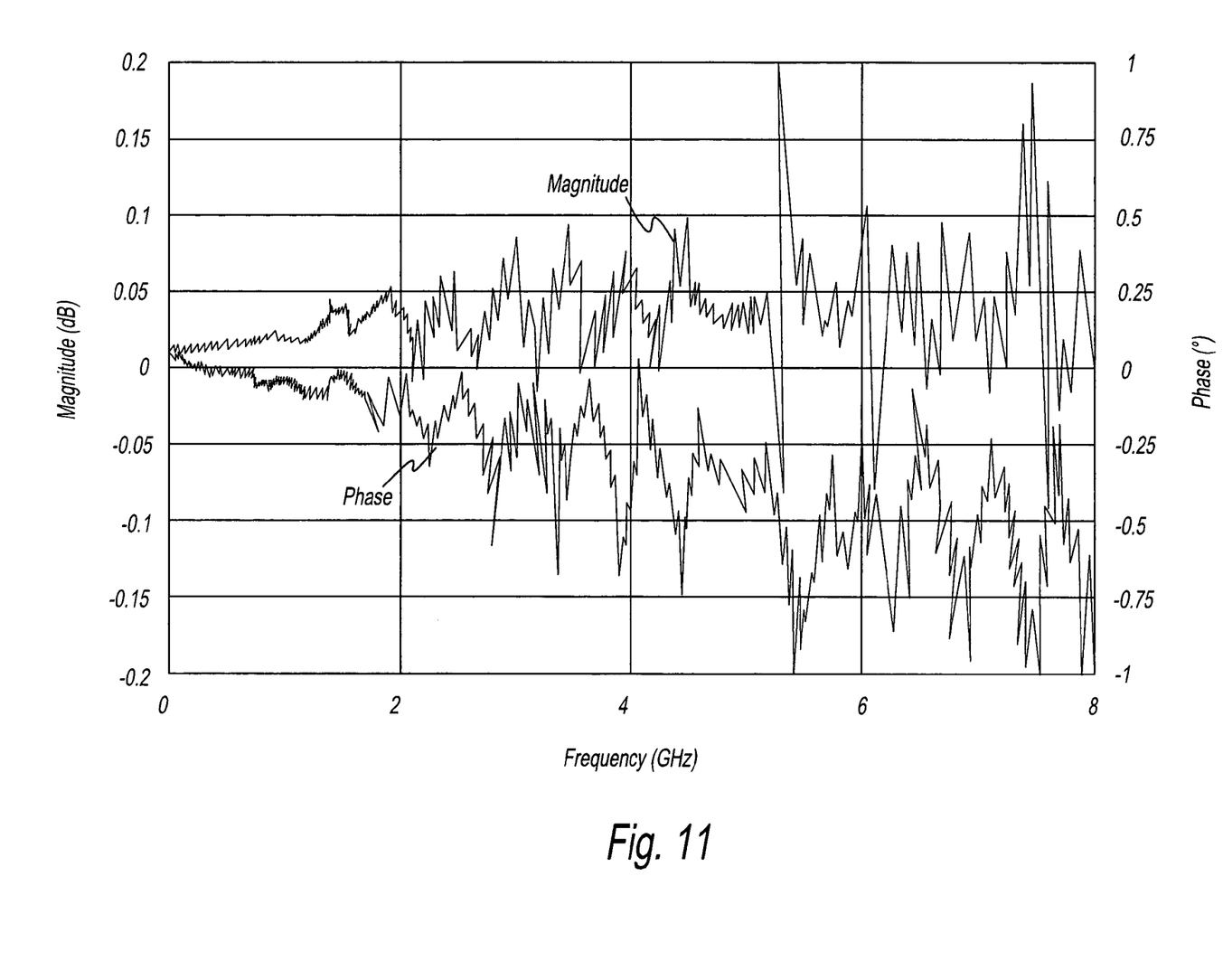
FIG. 11 is a graph showing the calibration consistency as calculated by the verification method of the present invention.
Figure 12:
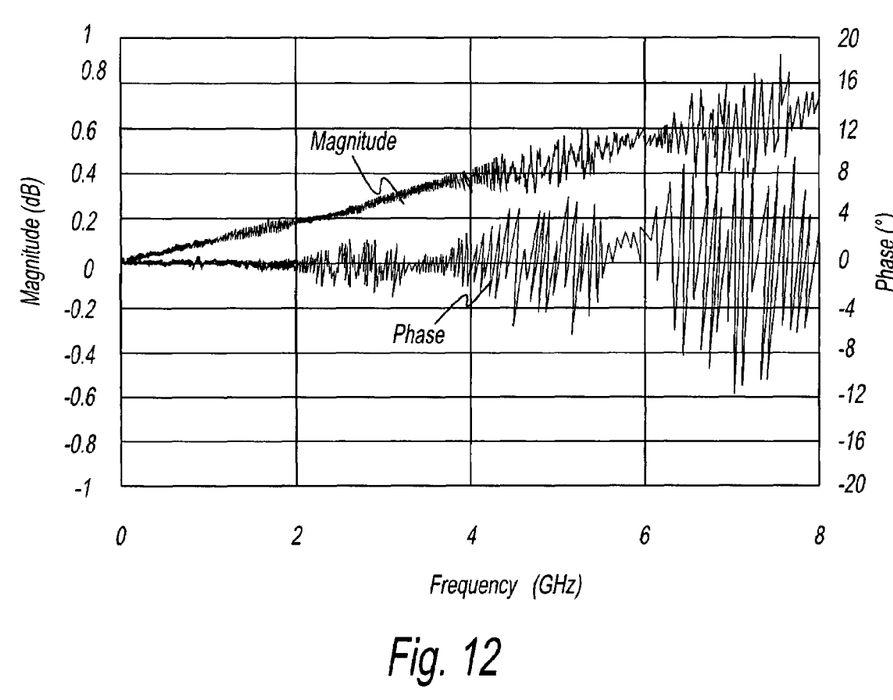
FIG. 12 is a graph showing the calibration consistency as calculated by the verification method of the present invention.
Figure 13:
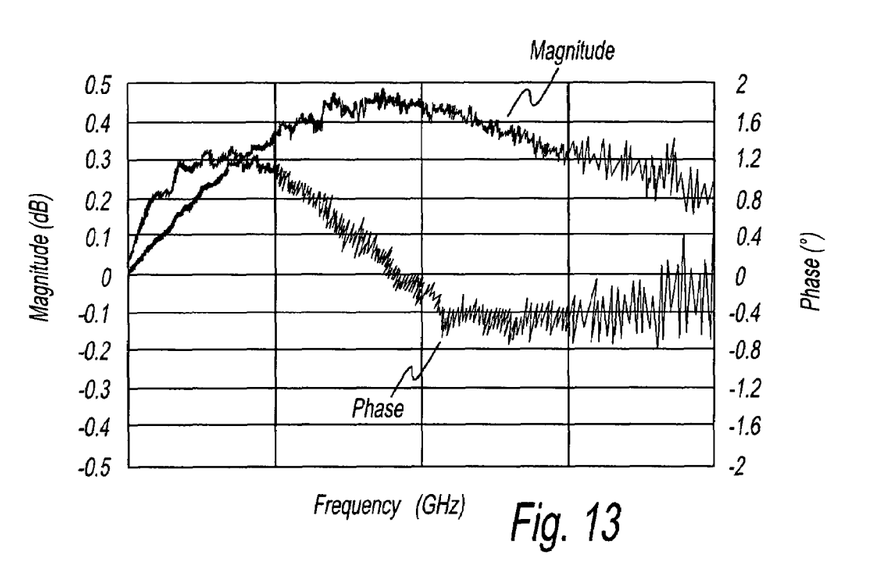
FIG. 13 is a graph showing the calibration consistency as calculated by the verification method of the present invention.

Several examples of the output calculation results for the calibration consistency as calculated by the verification method of the present invention will now be given. FIGS. 10 through 13 are graphs with the magnitude of consistency on the left ordinate, the phase of consistency on the right ordinate, and the frequency on the abscissa. FIG. 11 is an example of a graph showing the calibration consistency when connectors are fastened manually without using a torque wrench. FIG. 12 is an example of a graph of the calibration consistency when the defined values of the standards are mis-entered in the network analyzer. FIG. 13 is an example of a graph of the calibration consistency when a cable of poor stability is used. FIGS. 11 through 13 plot the magnitude or phase of the consistency at positions away from zero, showing that the calibration steps were not all performed uniformly and there are mistakes in the calibration.

What is claimed is:

1. A method to verify a SOLT calibration of a network analyzer whereby full n-port calibration of a network analyzer is verified, said method comprising:
   calculating one or more consistency values solely from error terms obtained by said calibration;
   comparing said one or more calculated consistency values to a pre-determined value to produce a verification result; and
   outputting said verification result.

2. A method to verify a SOLT calibration of a network analyzer whereby full n-port calibration of a network analyzer is verified, said method comprising:
   obtaining error terms from said calibration;
   calculating one or more consistency values by entering each error term obtained by said calibration into the following equation:

$$\frac{Et_{ji}}{Er_j + Ed_j * [El_{ji} - Es_j]} * \frac{Et_{ij}}{Er_i + Ed_i * [El_{ij} - Es_i]}$$

wherein $Ed_i$ is substituted for forward directivity, $Ed_j$ for reverse directivity; $Es_i$ for forward source match, $Es_j$ for reverse source match, $Er_i$ for forward reflection tracking, $Er_j$ for reverse reflection tracking, $Et_{ji}$ for forward transmission tracking, $Et_{ij}$ for reverse transmission tracking, $Ex_{ji}$ for forward isolation, $Ex_{ij}$ for reverse isolation, $El_{ji}$ for forward load match, and $El_{ij}$ for reverse load match;
   comparing said one or more calculated consistency values to a pre-determined value to produce a verification result; and
   outputting said verification result.

3. A network analyzer comprising:
   a controller for performing a verification of a SOLT calibration; and
   a calculator for calculating at least one consistency value solely from error terms produced by said SOLT calibration.

4. The network analyzer according to claim 3, further comprising a microprocessor for comparing one or more consistency values calculated by said calculator to a pre-determined value.

5. A network analyzer comprising:
   a controller for performing a verification method by calculating one or more consistency values by entering each error term obtained by a SOLT calibration into the following equation:

$$\frac{Et_{ji}}{Er_j + Ed_j * [El_{ji} - Es_j]} * \frac{Et_{ij}}{Er_i + Ed_i * [El_{ij} - Es_i]}$$

wherein $Ed_i$ is substituted for forward directivity, $Ed_j$ for reverse directivity; $Es_i$ for forward source match, $Es_j$ for reverse source match, $Er_i$ for forward reflection tracking, $Er_j$ for reverse reflection tracking, $Et_{ji}$ for forward transmission tracking, $Et_{ij}$ for reverse transmission tracking, $Ex_{ji}$ for forward isolation, $Ex_{ij}$ for reverse isolation, $El_{ji}$ for forward load match, and $El_{ij}$ for reverse load match.

6. The network analyzer according to claim 5, further comprising a microprocessor for comparing said one or more calculated consistency values to a pre-determined value.

7. A computer readable storage medium having a set of instructions stored therein, wherein said set of instructions causes a computer system to perform the following steps:
   reading error terms obtained by a SOLT calibration from a network analyzer;
   calculating one or more consistency values during said SOLT calibration using said error terms that have been read; and
   verifying the result of said SOLT calibration by assessing said one or more consistency values.

8. The storage medium according to claim 7, wherein said set of instructions includes instructions for performing a further step of:
   comparing said one or more consistency values calculated by said calculator to a pre-determined value.

9. A computer readable storage medium having a set of instructions stored therein, wherein said set of instructions causes a computer system to perform the following steps:
   reading error terms from a network analyzer, obtained by a SOLT calibration;
   calculating one or more consistency values by entering each of said error terms that have been read into to the following equation:

$$\frac{Et_{ji}}{Er_j + Ed_j * [El_{ji} - Es_j]} * \frac{Et_{ij}}{Er_i + Ed_i * [El_{ij} - Es_i]}$$

wherein $Ed_i$ is substituted for forward directivity, $Ed_j$ for reverse directivity; $Es_i$ for forward source match, $Es_j$ for reverse source match, $Er_i$ for forward reflection tracking, $Er_j$ for reverse reflection tracking, $Et_{ji}$ for forward transmission tracking, $Et_{ij}$ for reverse transmission tracking, $Ex_{ji}$ for forward isolation, $Ex_{ij}$ for reverse isolation, $El_{ji}$ for forward load match, and $El_{ij}$ for reverse load match; and
   verifying the result of said calibration by assessing said one or more consistency values.

10. The storage medium according to claim 9, wherein said set of instructions includes instructions for performing a further step of:
    comparing said one or more calculated consistency values to a pre-determined value.

* * * * *

UNITED STATES PATENT AND TRADEMARK OFFICE
CERTIFICATE OF CORRECTION

PATENT NO. : 7,474,975 B2 Page 1 of 1
APPLICATION NO. : 11/717352
DATED : January 6, 2009
INVENTOR(S) : Komatsu It is certified that error appears in the above-identified patent and that said Letters Patent is hereby corrected as shown below:

In column 12, line 11, in Claim 5, delete "Etj" and insert -- Etij --, therefor.

In column 12, line 41, in Claim 9, after "into" delete "to".

In column 12, line 54, in Claim 9, delete "Elij" and insert -- Elji --, therefor.

Signed and Sealed this

Twenty-eighth Day of April, 2009

JOHN DOLL
*Acting Director of the United States Patent and Trademark Office*